(12) United States Patent
Chen et al.

(10) Patent No.: US 8,502,715 B2
(45) Date of Patent: Aug. 6, 2013

(54) SIGNAL PROCESSING SYSTEM AND SELF-CALIBRATION DIGITAL-TO-ANALOG CONVERTING METHOD THEREOF

(75) Inventors: Yu-Sheng Chen, Taoyuan County (TW); Jia-Shian Tsai, Hsinchu County (TW); Yu-Tso Lin, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 116 days.

(21) Appl. No.: 13/181,517

(22) Filed: Jul. 13, 2011

(65) Prior Publication Data
US 2012/0293349 A1     Nov. 22, 2012

(30) Foreign Application Priority Data
May 20, 2011 (TW) .............................. 100117787 A

(51) Int. Cl.
*H03M 1/10*     (2006.01)

(52) U.S. Cl.
USPC .......................................... 341/120; 341/144

(58) Field of Classification Search
USPC .................................................. 341/120, 144
See application file for complete search history.

(56) References Cited

U.S. PATENT DOCUMENTS 5,278,558 A * 1/1994 Roth .............................. 341/120
5,666,118 A * 9/1997 Gersbach ...................... 341/120

* cited by examiner

*Primary Examiner* — Khai M Nguyen
(74) *Attorney, Agent, or Firm* — Jianq Chyun IP Office

(57) ABSTRACT

A signal processing system including a DAC, a comparing unit, and a control unit is provided. The DAC receives a digital input and generates an output voltage. The comparing unit receives the output voltage and compares the output voltage with a reference voltage to output an output value. The control unit receives the output value and accordingly generates the digital input in a manner of value mapping through firmware or software to calibrate the DAC. Furthermore, a self-calibration digital-to-analog converting method is also provided.

12 Claims, 6 Drawing Sheets

| $R_{RADJ}$ Variation percentage | $V_{OUT1}(V)$ | $S_D$ | $S_{IN}$(N bits) |
|---|---|---|---|
| $R_{P(X-1)}\%\sim R_{PX}\%$ | $V_{PX}$ | Level$_{PX}$ ↓ | XXX |
| $R_{P3}\%\sim R_{P4}\%$ | $V_{PB}\sim V_{PA}$ | Level$_{PB}\sim$Level$_{PA}$ | XXX |
| $R_{P1}\%\sim R_{P2}\%$ | $\sim V_{PA}$ | ---- | XXX |
| 0% | $V_{TYP}$ | ---- | XXX |
| $-R_{N1}\%\sim -R_{N2}\%$ | $\sim V_{NA}$ | ---- | XXX |
| $-R_{N3}\%\sim -R_{N4}\%$ | $V_{NA}\sim V_{NB}$ | Level$_{NA}\sim$Level$_{NB}$ | XXX |
| $-R_{N(X-1)}\%\sim -R_{NX}\%$ | $V_{NX}$ | Level$_{NX}$ ↑ | XXX |

FIG. 7

SIGNAL PROCESSING SYSTEM AND SELF-CALIBRATION DIGITAL-TO-ANALOG CONVERTING METHOD THEREOF

CROSS-REFERENCE TO RELATED APPLICATION

This application claims the priority benefit of Taiwan application serial no. 100117787, filed May 20, 2011. The entirety of the above-mentioned patent application is hereby incorporated by reference herein and made a part of this specification.

BACKGROUND OF THE INVENTION

1. Field of the Invention

The invention relates to a signal processing system and a digital-to-analog converting method thereof. Particularly, the invention relates to a signal processing system having a self-calibration mechanism and a digital-to-analog converting method thereof.

2. Description of Related Art

Digital-to-analog converters (DACs) are widely used in digital circuits, for example, a video DAC and a TVDAC, etc. The conventional DAC generally has an external resistor, and a function thereof is to serve as a reference resistance when an internal reference current of the DAC is output. However, although the design of connecting the external resistor to the DAC can reduce an influence of fabrication process variation, such design still has a chance to cause yield loss due to fabrication process variation.

SUMMARY OF THE INVENTION

The invention is directed to a signal processing system, in which a digital-to-analog converter (DAC) has a self-calibration mechanism, so as to avoid an influence of a fabrication process variation to increase a production yield.

The invention is directed to a self-calibration digital-to-analog converting method adapted to a DAC inbuilt with a reference resistor, by which the DAC may have a self-calibration mechanism to avoid an influence of a fabrication process variation, so as to increase a production yield.

The invention provides a signal processing system including a DAC, a comparing unit, and a control unit. The DAC receives a digital input and generates a first output voltage. The comparing unit receives the first output voltage and compares the first output voltage with a first reference voltage to output an output value. The control unit receives the output value and accordingly generates the digital input in a manner of value mapping through firmware or software to calibrate the DAC.

In an embodiment of the invention, the DAC includes a reference resistor. The control unit selects to increase or decrease a resistance of the reference resistor according to the output value, so as to calibrate the DAC.

In an embodiment of the invention, the DAC includes a reference current source and a current source array. The control unit selects to increase or decrease a mirror ratio of the reference current source and the current source array according to the output value, so as to calibrate the DAC.

In an embodiment of the invention, the DAC receives a second reference voltage. The control unit selects to increase or decrease the second reference voltage according to the output value, so as to calibrate the DAC.

In an embodiment of the invention, the signal processing system further includes a test compensation unit. The test compensation unit outputs a testing signal to the DAC, and the DAC generates a second output voltage. The test compensation unit determines whether the second output voltage is matched to the testing signal.

In an embodiment of the invention, the DAC includes a compensation current source adapted to provide a compensation current. The test compensation unit selects to increase or decrease the compensation current according to a determination result thereof.

In an embodiment of the invention, the control unit includes a look-up table. When the digital input is generated in the manner of value mapping, the control unit looks up the digital input corresponding to the output value from the look-up table, so as to calibrate the DAC.

The invention provides a self-calibration digital-to-analog converting method adapted to a DAC. The self-calibration digital-to-analog converting method includes following steps. A digital input is received to generate a first output voltage. The first output voltage is received, and the first output voltage is compared with a first reference voltage to generate an output value. The output value is received, and the digital input is generated in a manner of value mapping through firmware or software to calibrate the DAC.

In an embodiment of the invention, the DAC includes a reference resistor. The step of calibrating the DAC comprises selecting to increase or decrease a resistance of the reference resistor according to the output value, so as to calibrate the DAC.

In an embodiment of the invention, the DAC includes a reference current source and a current source array. The step of calibrating the DAC comprises selecting to increase or decrease a mirror ratio of the reference current source and the current source array according to the output value, so as to calibrate the DAC.

In an embodiment of the invention, the DAC receives a second reference voltage. The step of calibrating the DAC comprises selecting to increase or decrease the second reference voltage according to the output value, so as to calibrate the DAC.

In an embodiment of the invention, the self-calibration digital-to-analog converting method further includes following steps. A testing signal is input to the DAC, and the DAC generates a second output voltage. It is determined whether the second output voltage is matched to the testing signal.

In an embodiment of the invention, the DAC includes a compensation current source adapted to provide a compensation current. The self-calibration digital-to-analog converting method further includes selecting to increase or decrease the compensation current according to a determination result.

In an embodiment of the invention, the step of generating the digital input in the manner of value mapping through firmware or software comprises looking up the digital input corresponding to the output value from a look-up table, so as to calibrate the DAC.

According to the above descriptions, in the embodiment of the invention, the DAC is inbuilt with a reference resistor, and applies the aforementioned digital-to-analog converting method to achieve a self-calibration mechanism, so as to avoid an influence of a fabrication process variation to increase a production yield.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated

FIG. 7 illustrates a look-up table according to an embodiment of the invention.

DETAILED DESCRIPTION OF DISCLOSED EMBODIMENTS

If a reference resistor externally connected to a digital-to-analog converter (DAC) according to a conventional technique is built in the DAC, the inbuilt reference resistor may have different resistances due to influence of a fabrication process variation, so that a level of an operating voltage output by the DAC is shifted, which may decrease a chip yield as an operation range is changed.

Accordingly, in an embodiment of the invention, according to a self-calibration digital-to-analog converting method, a feedback comparison is performed on the output voltage of the DAC, and by adjusting a resistance of a reference resistor, adjusting a mirror ratio of a reference current source and a current source array, adjusting a reference voltage or adjusting a compensation current, influence of the fabrication process variation is reduced so as to improve the chip yield and achieve a low cost and high performance circuit design.

Figure 1:
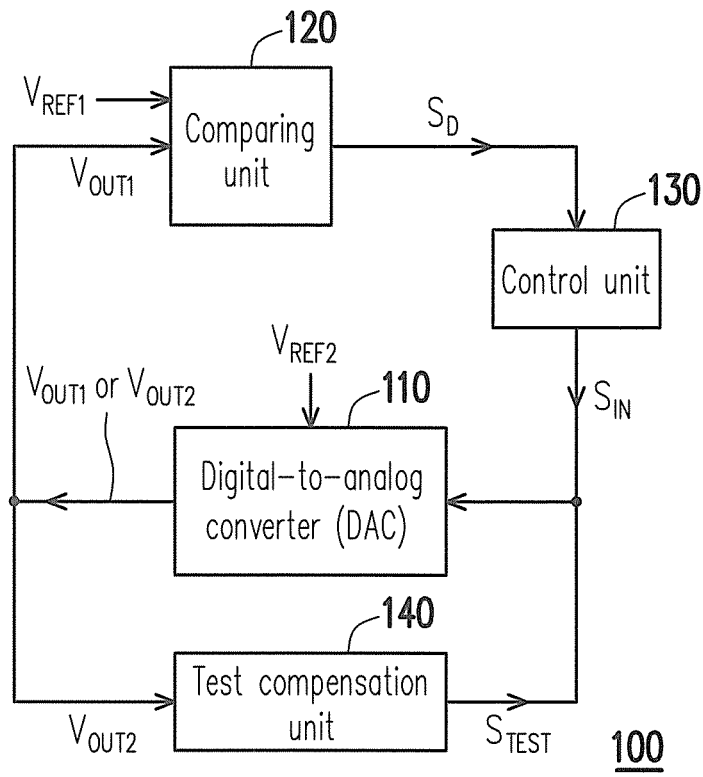
FIG. 1 is a functional block diagram of a signal processing system according to an embodiment of the invention.

FIG. 1 is a functional block diagram of a signal processing system according to an embodiment of the invention. Referring to FIG. 1, in the present embodiment, the signal processing system 100 includes a DAC 110, a comparing unit 120, a control unit 130 and a test compensation unit 140. The DAC 110 receives a digital input $S_{IN}$ and generates a first output voltage $V_{OUT1}$. The comparing unit 120 receives the first output voltage $V_{OUT1}$ and compares the first output voltage $V_{OUT1}$ with a first reference voltage $V_{REF1}$ to generate an output value $S_D$. The control unit 130 receives the output value $S_D$ and accordingly generates the digital input $S_{IN}$ in a manner of value mapping through firmware or software to calibrate the DAC 110. Here, the signal processing system 100, for example, processes a video image signal.

Figure 2:
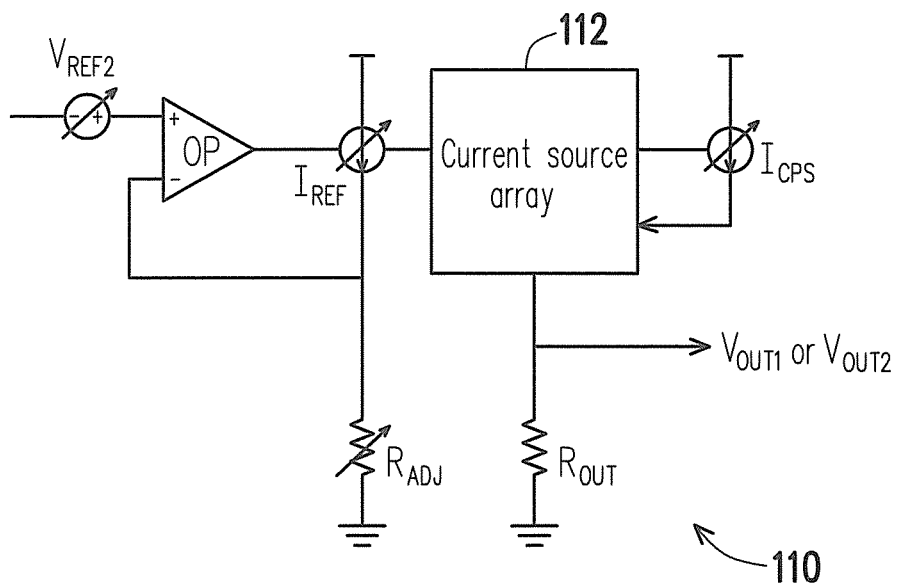
FIG. 2 is a circuit schematic diagram of a digital-to-analog converter (DAC) of FIG. 1.

In detail, FIG. 2 is a circuit schematic diagram of the DAC of FIG. 1. Referring to FIG. 2, in the present embodiment, the DAC 110 includes an operation amplifier OP, a current source array 112, a reference resistor $R_{ADJ}$, a reference current source $I_{REF}$, an output resistor $R_{OUT}$ and a compensation current source $I_{CPS}$.

In the present embodiment, the DAC 110 is coupled to the comparing unit 120 and outputs the first output voltage $V_{OUT1}$ to the comparing unit 120, and the comparing unit 120 compares the first output voltage $V_{OUT1}$ with the specific first reference voltage $V_{REF1}$. For example, the comparing unit 120 is, for example, an analog-to-digital converter (ADC) or a comparator. If the comparing unit 120 is implemented by a comparator, the comparator receives the first output voltage $V_{OUT1}$ and the first reference voltage $V_{REF1}$ for comparison to obtain a level of the first output voltage $V_{OUT1}$, as that shown in FIG. 1. If the comparing unit 120 is implemented by an ADC, the ADC converts the first output voltage $V_{OUT1}$ into a digital signal to represent the level of the first output voltage $V_{OUT1}$. In other words, now the comparing unit 120 is unnecessary to additionally receive the first reference voltage $V_{REF1}$.

Then, the signal processing system 100 adjusts a resistance of the reference resistor $R_{ADJ}$, adjusts a second reference voltage $V_{REF2}$ or adjusts a mirror ratio of the reference current source $I_{REF}$ and the current source array 112 through the control unit 130 for calibration. Alternatively, the signal processing system 100 can also adjust the compensation current $I_{CPS}$ through the test compensation unit 140 to compensate an offset of the first output voltage $V_{OUT1}$ caused by differential non-linearity (DNL).

Further, after the first output voltage $V_{OUT1}$ is output to the ADC or the comparator, a comparison result thereof is transmitted to the control unit 130. Then, the control unit 130 determines how to adjust the DAC 110 through firmware or software according to a predetermined condition. For example, the control unit 130 can select to adjust the reference resistor $R_{ADJ}$, adjust the second reference voltage $V_{REF2}$ or adjust the mirror ratio of the reference current source $I_{REF}$ and the current source array 112 through a voltage current source conversion loop. The voltage current source conversion loop may include the operation amplifier OP, the reference resistor $R_{ADJ}$ and the reference current source $I_{REF}$.

Figure 3:
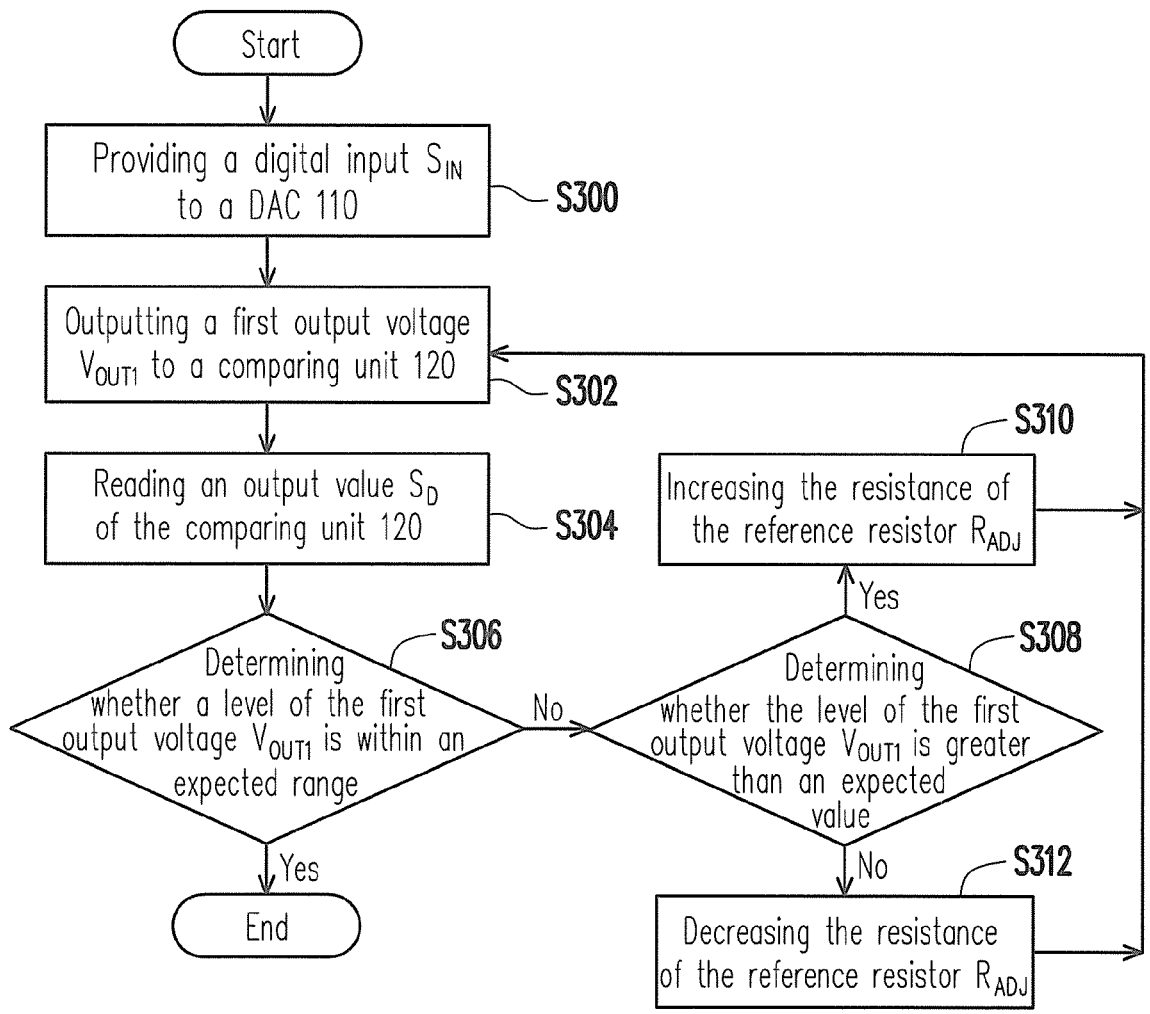
FIG. 3 is a flowchart illustrating a method of adjusting a resistance of a reference resistor according to an embodiment of the invention.

In detail, FIG. 3 is a flowchart illustrating a method that a control unit adjusts a resistance of a reference resistor according to an embodiment of the invention. Referring to FIG. 1 to FIG. 3, in the present embodiment, the self-calibration digital-to-analog converting method is, for example, adapted to the signal processing system 100 and the DAC 110 shown in FIG. 1 and FIG. 2, though the invention is not limited thereto.

First, in step S300, the control unit 130 provides the digital input $S_{IN}$ to the DAC 110. The digital input $S_{IN}$ is, for example, a video image signal. Then, in step S302, the DAC 110 outputs the first output voltage $V_{OUT1}$ to the comparing unit 120 according to the digital input $S_{IN}$. Then, in step S304, the control unit 130 reads the output value $S_D$ of the comparing unit 120 to determine whether a level of the first output voltage $V_{OUT1}$ is within an expected range. In the present embodiment, the comparing unit 120 is, for example, an ADC, so that the output value $S_D$ is, for example, a digital signal obtained by analog-to-digital converting the first output voltage $V_{OUT1}$, which represents the level of the first output voltage $V_{OUT1}$.

Then, in step S306, the control unit 130 determines whether the level of the first output voltage $V_{OUT1}$ is within the expected range. If the level of the first output voltage $V_{OUT1}$ is within the expected range, it represents that the reference resistor $R_{ADJ}$ is less influenced by the fabrication process variation, and now the control unit 130 does not adjust the resistance of the reference resistor $R_{ADJ}$, and the self-calibration is ended. Comparatively, if the level of the first output voltage $V_{OUT1}$ is not within the expected range, the control unit 130 adjusts the resistance of the reference resistor $R_{ADJ}$ to implement the self-calibration. Therefore, if the level of the first output voltage $V_{OUT1}$ is not within the expected range, a step S308 of the self-calibration digital-to-analog converting method is executed.

In the step S308, the control unit 130 further determines whether the level of the first output voltage $V_{OUT1}$ is greater than a specific expected value. In step S310, if the level of the first output voltage $V_{OUT1}$ is greater than the expected value, the control unit 130 increases the resistance of the reference resistor $R_{ADJ}$ to implement the self-calibration. Comparatively, in step S312, if the level of the first output voltage $V_{OUT1}$ is smaller than or equal to the expected value, the control unit 130 decreases the resistance of the reference resistor $R_{ADJ}$, which may also implement the self-calibration. Therefore, after the control unit 130 executes the step S310 or S312, the self-calibration digital-to-analog converting method is returned back to the step S302 to repeat the self-calibration. In other words, according to the above self-calibration method, the control unit 130 determines whether or not to adjust the resistance of the reference resistor $R_{ADJ}$ to accordingly adjust the first output voltage $V_{OUT1}$ according to whether the level of the first output voltage $V_{OUT1}$ is within the expected range.

It should be noticed that in the voltage current source conversion loop, when the resistance of the reference resistor $R_{ADJ}$ is increased, the reference current provided by the reference current source $I_{REF}$ is decreased, so that the level of the first output voltage $V_{OUT1}$ can be smaller than the expected value. Comparatively, when the resistance of the reference resistor $R_{ADJ}$ is decreased, the reference current provided by the reference current source $I_{REF}$ is increased, so that the level of the first output voltage $V_{OUT1}$ can be greater than the expected value.

In other words, in the present embodiment, after the control unit 130 reads the output value $S_D$, it selects to increase or decrease the resistance of the reference resistor $R_{ADJ}$ according to the output value $S_D$, so as to calibrate the DAC 110. Moreover, the self-calibration digital-to-analog converting method of the present embodiment can reduce the influence of the fabrication process variation by adjusting the resistance of the reference resistor $R_{ADJ}$ of the DAC 110. In another embodiment, the self-calibration digital-to-analog converting method of the present embodiment can select to adjust the mirror ratio of the reference current source $I_{REF}$ and the current source array 112 of the DAC 110, or adjust the second reference voltage $V_{REF2}$ received by the DAC 110, so as to adjust the first output voltage $V_{OUT1}$ to reduce the influence of the fabrication process variation.

Figure 4:
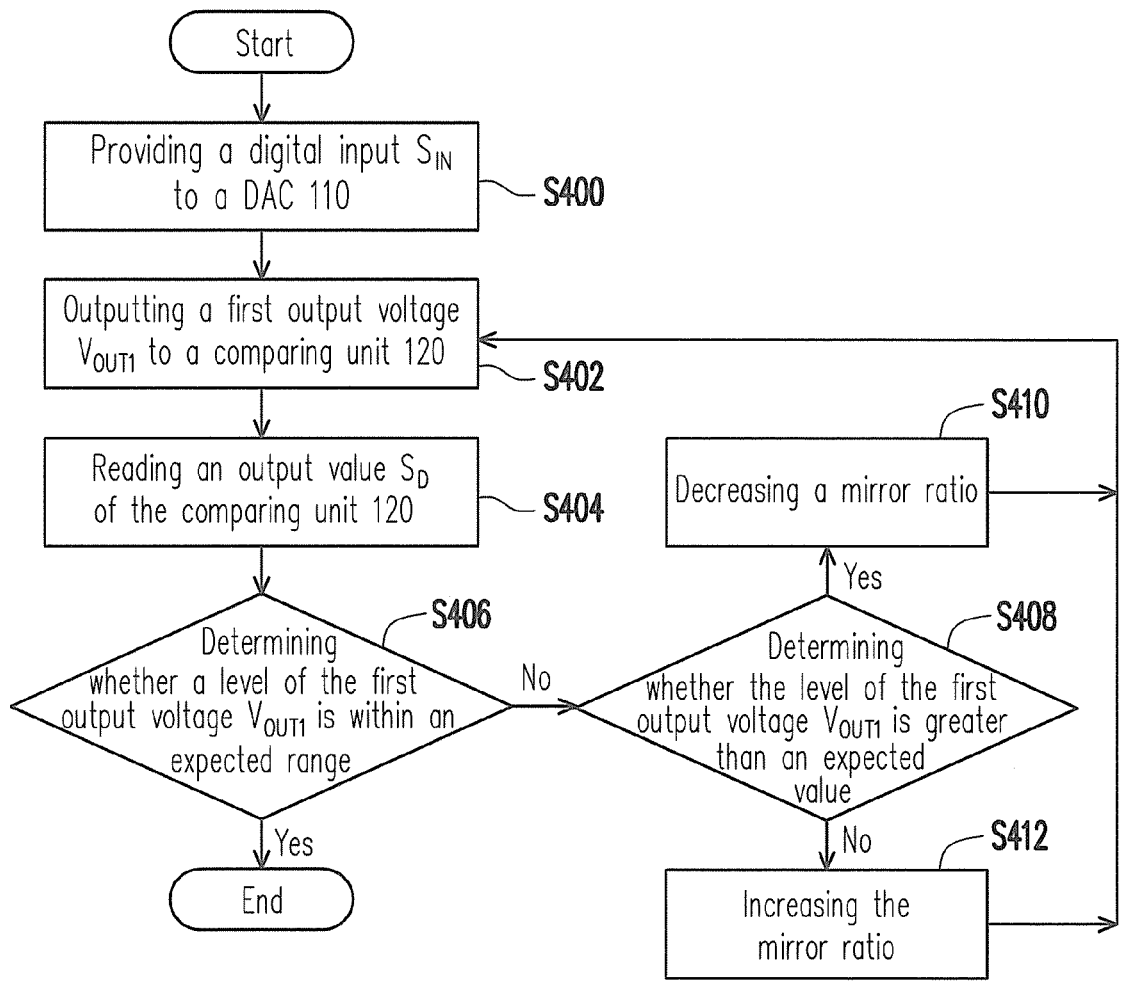
FIG. 4 is a flowchart illustrating a method of adjusting a mirror ratio of a reference current source and a current source array according to an embodiment of the invention.

FIG. 4 is a flowchart illustrating a method that the control unit adjusts a mirror ratio of a reference current source and a current source array according to an embodiment of the invention. Referring to FIG. 1, and FIG. 2 to FIG. 4, in the present embodiment, the reference current source $I_{REF}$ and the current source array 112 are, for example, implemented by a plurality of current mirrors, so that by adjusting the mirror ratio there between, an output current of the current source array 112 is changed, so as to achieve an effect of adjusting the first output voltage $V_{OUT1}$.

In the present embodiment, the so-called "mirror ratio" refers to a ratio of numbers of master/slave transistors used for consisting current mirrors in the reference current source $I_{REF}$ and the current source array 112. Generally, if width/length ratios of the transistors used for implementing the current mirrors are the same, according to the ratio of the numbers of the master/slave transistors, a slave side current of the current mirror can be deduced according to a master side current. For example, in the present embodiment, if the reference current provided by the reference current source $I_{REF}$ is the master side current of the current mirror, the output current of the current source array 112 is the slave side current, and when the ratio of the numbers of the master/slave transistors is 1:10, it can be deduced that the output current of the current source array 112 is 10 times of the reference current provided by the reference current source $I_{REF}$. In other words, when the reference current provided by the reference current source $I_{REF}$ is fixed, by adjusting the mirror ratio, the output current of the current source array 112 is changed.

In the present embodiment, the self-calibration digital-to-analog converting method of adjusting the mirror ratio is similar to the self-calibration digital-to-analog converting method of adjusting the resistance of the reference resistor of FIG. 3, and a difference there between lies in steps S410 and S412. In the step S410, if the level of the first output voltage $V_{OUT1}$ is greater than the expected value, the control unit 130 decreases the mirror ratio of the reference current source $I_{REF}$ and the current source array 112. Comparatively, in the step S412, if the level of the first output voltage $V_{OUT1}$ is smaller than or equal to the expected value, the control unit 130 increases the mirror ratio there between. Therefore, by adjusting the mirror ratio, the self-calibration digital-to-analog converting method can also achieve the effect of self-calibration.

In other words, in the present embodiment, after the control unit 130 reads the output value $S_D$, it selects to increase or decrease the mirror ratio of the reference current source $I_{REF}$ and the current source array 112 according to the output value $S_D$, so as to calibrate the DAC 110. In another embodiment, the self-calibration digital-to-analog converting method can also can select to adjust the second reference voltage $V_{REF2}$ received by the DAC 110, so as to adjust the first output voltage $V_{OUT1}$ to reduce the influence of the fabrication process variation.

Figure 5:
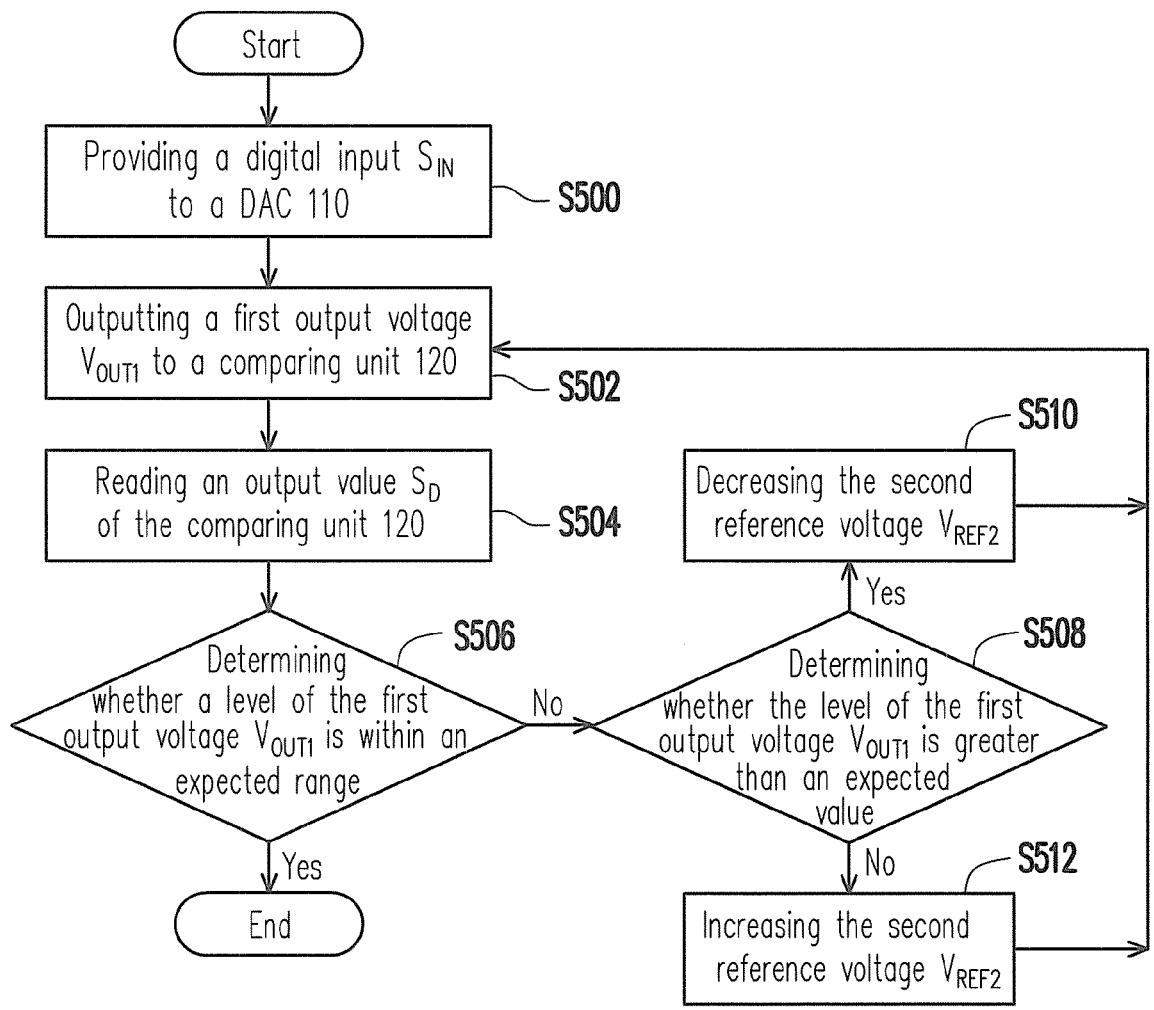
FIG. 5 is a flowchart illustrating a method of adjusting a second reference voltage according to an embodiment of the invention.

FIG. 5 is a flowchart illustrating a method that the control unit adjusts a second reference voltage according to an embodiment of the invention. Referring to FIG. 1, and FIG. 2 to FIG. 5, in the present embodiment, a non-inverting input terminal of the operation amplifier OP is coupled to an adjustable second reference voltage $V_{REF2}$, and an inverting input terminal thereof is coupled to a node between the reference current source $I_{REF}$ and the reference resistor $R_{ADJ}$. Therefore, when the second reference voltage $V_{REF2}$ is changed, the current flowing through the reference resistor $R_{ADJ}$ is changed, and the output current of the current source array is accordingly changed, so as to achieve the effect of adjusting the first output voltage $V_{OUT1}$.

In the present embodiment, the self-calibration digital-to-analog converting method of adjusting the second reference voltage is similar to the self-calibration digital-to-analog converting method of adjusting the resistance of the reference resistor of FIG. 3, and a difference therebetween lies in steps S510 and S512. In the step S510, if the level of the first output voltage $V_{OUT1}$ is greater than the expected value, the control unit 130 decreases the second reference voltage $V_{REF2}$. Comparatively, in the step S512, if the level of the first output voltage $V_{OUT1}$ is smaller than or equal to the expected value, the control unit 130 increases the second reference voltage $V_{REF2}$. Therefore, by adjusting the second reference voltage $V_{REF2}$, the self-calibration digital-to-analog converting method can also achieve the effect of self-calibration.

In other words, in the present embodiment, after the control unit 130 reads the output value $S_D$, it selects to increase or decrease the second reference voltage $V_{REF2}$ according to the output value $S_D$, so as to calibrate the DAC 110.

Figure 6:
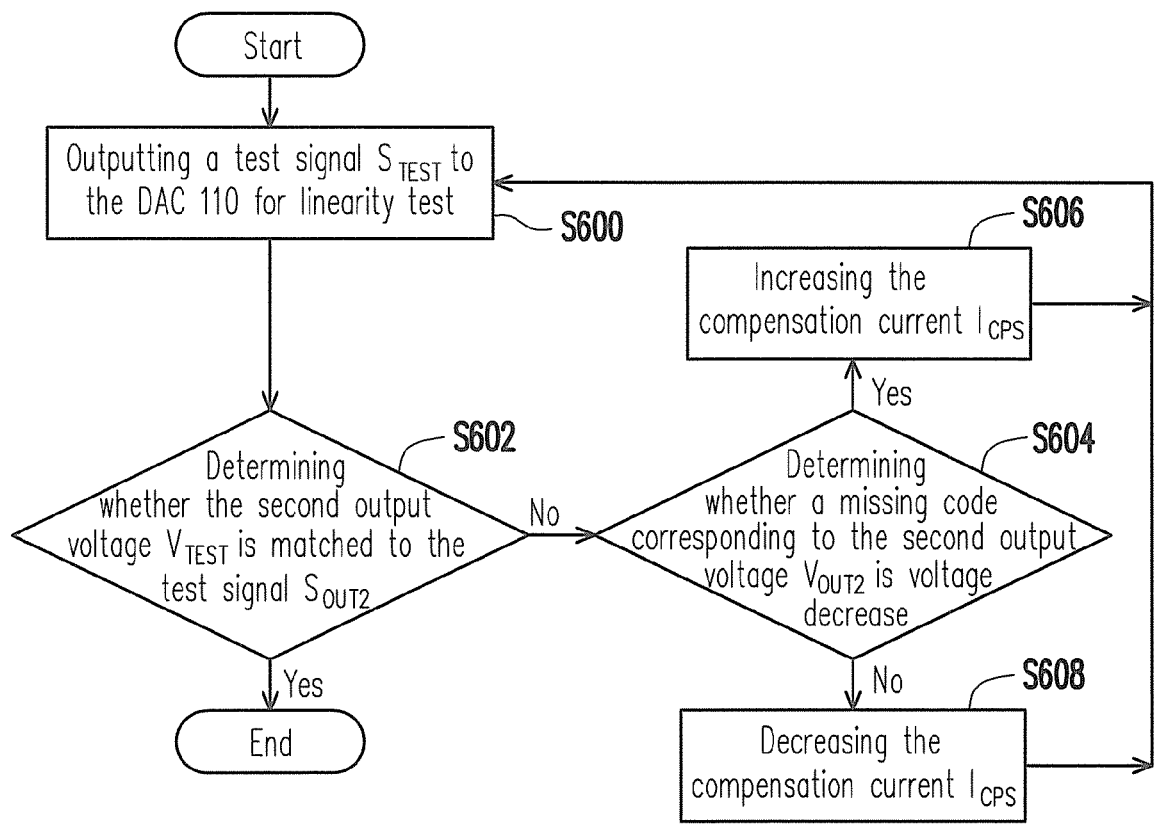
FIG. 6 is a flowchart illustrating a method of adjusting a compensation current according to an embodiment of the invention.

On the other hand, FIG. 6 is a flowchart illustrating a method that the test compensation unit adjust a compensation current according to an embodiment of the invention. Referring to FIG. 1, and FIG. 2 to FIG. 6, in the present embodiment, the test compensation unit 140 outputs a test signal $S_{TEST}$ to the DAC 110 to generate a second output voltage $V_{OUT2}$ (step S600). The test signal $S_{TEST}$ is, for example, a ramp signal, which is used to test linearity of the DAC 110.

Then, in step S602, it is determined whether the second output voltage $V_{OUT2}$ of the DAC 110 is matched to the test signal $S_{TEST}$. Here, if the test signal $S_{TEST}$ is a rising ramp signal, the second output voltage $V_{OUT2}$ must have a variation trend of monotonic rising for matching the test signal $S_{TEST}$. Similarly, if the test signal $S_{TEST}$ is a falling ramp signal, the second output voltage $V_{OUT2}$ must have a variation trend of monotonic falling for matching the test signal $S_{TEST}$. Then, the test compensation unit 140 determines whether or not to adjust the compensation current $I_{CPS}$ according to whether the second output voltage $V_{OUT2}$ is matched to the test signal $S_{TEST}$.

Therefore, when the second output voltage $V_{OUT2}$ is matched to the test signal $S_{TEST}$, the test compensation unit 140 does not adjust the compensation current $I_{CPS}$, and the operation of self-calibration is ended. When the second output voltage $V_{OUT2}$ is not matched to the test signal $S_{TEST}$, in step S604, the test compensation unit 140 determines whether a missing code corresponding to the second output voltage $V_{OUT2}$ is voltage decrease. If the missing code is voltage decrease, in step S606, the test compensation unit 140 increases the compensation current $I_{CPS}$. If the missing code is not voltage decrease, in step S608, the test compensation unit 140 decreases the compensation current $I_{CPS}$. Therefore, after the control unit 130 executes the step S606 or S608, the self-calibration digital-to-analog converting method is returned back to the step S600 to repeat the self-calibration. In other words, the test compensation unit of the present embodiment selects to increase or decrease the compensation current according to a determination result thereof.

Therefore, the signal processing system 100 can adjust the compensation current $I_{CPS}$ through the test compensation unit 140, so as to compensate the offset of the first output voltage $V_{OUT1}$ caused by differential non-linearity (DNL).

FIG. 7 illustrates a look-up table according to an embodiment of the invention. Referring to FIG. 1 and FIG. 7, in the present embodiment, the control unit 130 may include the look-up table shown in FIG. 7. When the digital input $S_{IN}$ is generated in the manner of value mapping, the control unit 130 can look up the digital input $S_{IN}$ corresponding to the output value $S_D$ from the look-up table, so as to calibrate the DAC 110.

In the look-up table, each row of the first column represents a variation percentage range of the reference resistor $R_{ADJ}$ relative to a standard resistance, and division of the ranges is determined by a compensation resolution. The second column to the fourth column respectively represent the first output voltage $V_{OUT1}$, the output value $S_D$ and the digital input $S_{IN}$ corresponding to each variation percentage range. In the look-up table of FIG. 7, magnitude relations of the parameters in the second column and the third column are respectively as follows: $V_{NX} > \ldots > V_{NB} > V_{NA} > V_{TYP} > V_{PA} > V_{PB} > \ldots > V_{PX}$; and $Level_{NX} > \ldots > Level_{NB} > Level_{NA} > Level_{PA} > Level_{PB} > \ldots > Level_{PX}$.

In the present embodiment, the output value $S_D$ and the digital input $S_{IN}$ are, for example, respectively a 10-bit and a 2-bit digital signal, where the bit number is determined according to the compensation resolution. For example, in a row of the variation percentage of 0%, it is assumed that the first output voltage $V_{TYP}=1.40$ volts, the reference resistor $R_{ADJ}$ and the standard resistance are almost the same, which is unnecessary to be adjusted. In a row of the variation percentage of $R_{P1}\%\sim R_{P2}\%$, the reference resistor $R_{ADJ}$ has a positive resistor variation, for example, +1%~+10%, so that the first output voltage $V_{OUT1}$ can be $V_{PA}=1.27$ volts. Comparatively, in a row of the variation percentage of $-R_{N1}\%\sim-R_{N2}\%$, the reference resistor $R_{ADJ}$ has a negative resistor variation, for example, -1%~-10%, so that the first output voltage $V_{OUT1}$ can be $V_{NA}=1.55$ volts. In the above three cases, the designer may select not to adjust the reference resistor $R_{ADJ}$ according to an actual design requirement, and set the digital input $S_{IN}$ to one of the patterns of the 2-bit digital signal, for example, $S_{IN}[0:1]=00$, where the bit number is determined by the compensation resolution.

On the other hand, in a row of the variation percentage of $R_{N3}\%\sim R_{N4}\%$, the reference resistor $R_{ADJ}$ has a negative resistor variation of $-11\%\sim-17\%$, and now a variation range $V_{NA}$-$V_{NB}$ of the first output voltage $V_{OUT1}$ is between 1.57 and 1.68 volts. Therefore, the comparing unit 120 compares the first output voltage $V_{OUT1}$ and the first reference voltage $V_{REF1}$, and the generated output value $S_D$ is between $Level_{NA}$ and $Level_{NB}$. When the output value $S_D$ is represented by the 10-bit digital signal, it is between 493 and 527. Now, the digital input $S_{IN}$ can be set to one of the patterns of the 2-bit digital signal, for example, $S_{IN}[0:1]=01$.

Moreover, in a row of the variation percentage of $R_{P(X-1)}\%\sim R_{PX}\%$, the reference resistor $R_{ADJ}$ has a positive resistor variation of $+11\%\sim+25\%$, and now the variation of first output voltage $V_{OUT1}$ may reach $V_{PX}=1.26$ volts. Therefore, the output value $S_D$ is below $Level_{PX}$. When the output value $S_D$ is represented by the 10-bit digital signal, it is smaller than 396. Now, the digital input $S_{IN}$ can be set to one of the patterns of the 2-bit digital signal, for example, $S_{IN}[0:1]=11$. Similarly, in a row of the variation percentage of $-R_{N(X-1)}\%\sim-R_{NX}\%$, the reference resistor $R_{ADJ}$ has a negative resistor variation of $-18\%\sim-25\%$, and $V_{NX}=1.86$ volts, $Level_{NX}=528$, and $S_{IN}[0:1]=10$.

In the present embodiment, the designer can divide variation percentage ranges of the reference resistor $R_{ADJ}$ relative to the standard resistance according to the compensation resolution, so as to design a suitable look-up table. Various values shown in the above embodiment are only used for description, and are not used to limit the invention. Moreover, although only the example of the reference resistor $R_{ADJ}$ is referred in the look-up table of FIG. 7, adjustments of the mirror ratio of the reference current source and the current source array, the second reference voltage and the compensation current source according to the look-up table can also be deduced, and details thereof are not repeated.

Therefore, in the present embodiment, based on the look-up table of FIG. 7, the control unit receives the output value $S_D$, and accordingly generates the digital input $S_{IN}$ in a manner of value mapping by firmware or software to calibrate the DAC 110.

In summary, in the embodiment of the invention, the DAC is inbuilt with a reference resistor, and applies the aforementioned digital-to-analog converting method to achieve a self-calibration mechanism, so as to avoid an influence of a fabrication process variation to increase a production yield. Moreover, digital-to-analog converting method of the invention can effectively mitigate a gain error and an offset error of the DAC.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:
1. A signal processing system, comprising:
  a digital-to-analog converter (DAC), receiving a digital input, and generating a first output voltage;

a comparing unit, receiving the first output voltage, and comparing the first output voltage with a first reference voltage to output an output value; and a control unit, receiving the output value, and accordingly generating the digital input in a manner of value mapping through firmware or software to calibrate the DAC, wherein the DAC comprises a reference resistor, and the control unit selects to increase or decrease a resistance of the reference resistor according to the output value, so as to calibrate the DAC.

2. The signal processing system as claimed in claim 1, wherein the DAC comprises a reference current source and a current source array, and the control unit selects to increase or decrease a minor ratio of the reference current source and the current source array according to the output value, so as to calibrate the DAC.

3. The signal processing system as claimed in claim 1, wherein the DAC receives a second reference voltage, and the control unit selects to increase or decrease the second reference voltage according to the output value, so as to calibrate the DAC.

4. The signal processing system as claimed in claim 1, further comprising:

a test compensation unit, outputting a testing signal to the DAC to enable the DAC generating a second output voltage, and determining whether the second output voltage is matched to the testing signal.

5. The signal processing system as claimed in claim 4, wherein the DAC comprise a compensation current source adapted to provide a compensation current, and the test compensation unit selects to increase or decrease the compensation current according to a determination result thereof.

6. The signal processing system as claimed in claim 1, wherein the control unit comprises a look-up table, and when the digital input is generated in the manner of value mapping, the control unit looks up the digital input corresponding to the output value from the look-up table, so as to calibrate the DAC.

7. A self-calibration digital-to-analog converting method, adapted to a digital-to-analog converter (DAC), the self-calibration digital-to-analog converting method comprising:

receiving a digital input, and generating a first output voltage;

receiving the first output voltage, and comparing the first output voltage with a first reference voltage to generate an output value; and receiving the output value, and generating the digital input in a manner of value mapping through firmware or software to calibrate the DAC,.

wherein the DAC comprises a reference resistor, and the step of calibrating the DAC comprises selecting to increase or decrease a resistance of the reference resistor according to the output value, so as to calibrate the DAC.

8. The self-calibration digital-to-analog converting method as claimed in claim 7, wherein the DAC comprises a reference current source and a current source array, and the step of calibrating the DAC comprises selecting to increase or decrease a mirror ratio of the reference current source and the current source array according to the output value, so as to calibrate the DAC.

9. The self-calibration digital-to-analog converting method as claimed in claim 7, wherein the DAC receives a second reference voltage, and the step of calibrating the DAC comprises selecting to increase or decrease the second reference voltage according to the output value, so as to calibrate the DAC.

10. The self-calibration digital-to-analog converting method as claimed in claim 7, further comprising:

inputting a testing signal to the DAC, and the DAC accordingly generating a second output voltage; and determining whether the second output voltage is matched to the testing signal.

11. The self-calibration digital-to-analog converting method as claimed in claim 10, wherein the DAC comprises a compensation current source adapted to provide a compensation current, and the self-calibration digital-to-analog converting method further comprises:

selecting to increase or decrease the compensation current according to the determination result.

12. The self-calibration digital-to-analog converting method as claimed in claim 7, wherein the step of generating the digital input in the manner of value mapping through firmware or software comprises:

looking up the digital input corresponding to the output value from a look-up table, so as to calibrate the DAC.

* * * * *